United States Patent
Thumser et al.

(10) Patent No.: US 8,863,375 B2
(45) Date of Patent: Oct. 21, 2014

(54) METHOD FOR CONNECTING A PLURALITY OF ELEMENTS OF A CIRCUIT BOARD

(75) Inventors: Christoph Thumser, Graz (AT); Gerhard Freydl, Leoben (AT)

(73) Assignee: AT & S Austria Technologie & Sytemtechnik Aktiengesellschaft, Leoben-Hinterberg (AT)

( * ) Notice: Subject to any disclaimer, the term of this patent is extended or adjusted under 35 U.S.C. 154(b) by 85 days.

(21) Appl. No.: 13/393,697

(22) PCT Filed: Sep. 1, 2010

(86) PCT No.: PCT/AT2010/000316
§ 371 (c)(1),
(2), (4) Date: Mar. 1, 2012

(87) PCT Pub. No.: WO2011/026165
PCT Pub. Date: Mar. 10, 2011

(65) Prior Publication Data
US 2012/0160555 A1  Jun. 28, 2012

(30) Foreign Application Priority Data
Sep. 3, 2009  (AT) ................. GM552/2009

(51) Int. Cl.
*H05K 3/30* (2006.01)
*H05K 3/00* (2006.01)
*H05K 1/14* (2006.01)
*H05K 1/02* (2006.01)

(52) U.S. Cl.
CPC ...... *H05K 1/142* (2013.01); *H05K 2201/09063* (2013.01); *H05K 1/0269* (2013.01); *H05K 2201/09918* (2013.01); *H05K 2203/167* (2013.01); *H05K 3/0097* (2013.01); *H05K 2201/09145* (2013.01); *H05K 2203/0169* (2013.01); *H05K 2201/10598* (2013.01)

USPC ................. 29/832; 29/825; 29/840

(58) Field of Classification Search
USPC ........................ 29/830, 832, 840
See application file for complete search history.

(56) References Cited

U.S. PATENT DOCUMENTS

| | | | | |
|---|---|---|---|---|
| 4,255,003 A | * | 3/1981 | Berg | 439/71 |
| 4,293,175 A | * | 10/1981 | Cutchaw | 439/72 |
| 4,689,103 A | | 8/1987 | Elarde | |
| 5,019,944 A | * | 5/1991 | Ishii et al. | 361/783 |
| 5,044,615 A | | 9/1991 | Newman | |
| 5,866,852 A | | 2/1999 | Benz | |

(Continued)

FOREIGN PATENT DOCUMENTS

| | | |
|---|---|---|
| DE | 196 00 928 | 7/1997 |
| JP | S61-265219 A | 11/1986 |
| WO | 03/005785 | 1/2003 |
| WO | 2009/068741 | 6/2009 |

*Primary Examiner* — Carl Arbes
(74) *Attorney, Agent, or Firm* — Jacobson Holman, PLLC.

(57) ABSTRACT

The invention relates to a method for connecting a plurality of elements for a circuit board, comprising the following steps:
providing the elements of a circuit board to be connected to each other, the elements having contours adapted to each other;
arranging the elements to be connected to each other in close proximity in at least one of two peripheral areas that have complementary contours, while maintaining a distance between opposing peripheral areas; and
mechanically connecting the opposing peripheral areas by means of at least one sub-area thereof in order to connect the elements of the circuit board to be connected to each other.
Furthermore, a circuit board produced from a plurality of elements connected to each other is provided.

13 Claims, 4 Drawing Sheets

(56) References Cited

U.S. PATENT DOCUMENTS

| | | |
|---|---|---|
| 6,817,527 B2 * | 11/2004 | Hellberg et al. ......... 235/462.01 |
| 7,119,436 B2 * | 10/2006 | Lien ............................. 257/723 |
| 7,439,451 B2 * | 10/2008 | Naito et al. ................... 174/260 |
| 7,559,138 B2 * | 7/2009 | Sin ................................. 29/830 |
| 2001/0053565 A1 * | 12/2001 | Khoury ........................ 438/121 |
| 2005/0070163 A1 | 3/2005 | Redmond, III et al. |
| 2008/0144299 A1 | 6/2008 | Redmond |
| 2009/0014205 A1 * | 1/2009 | Kobayashi et al. ........... 174/255 |

\* cited by examiner

Fig. 1
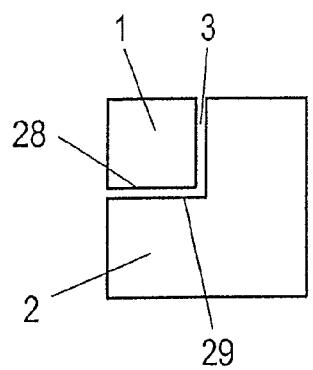
Fig. 1a
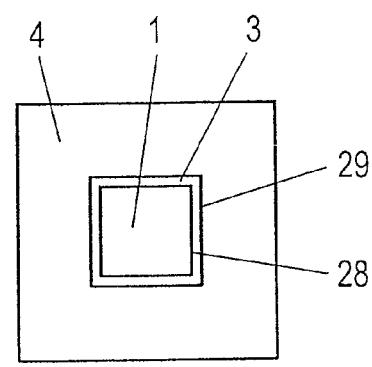
Fig. 1b
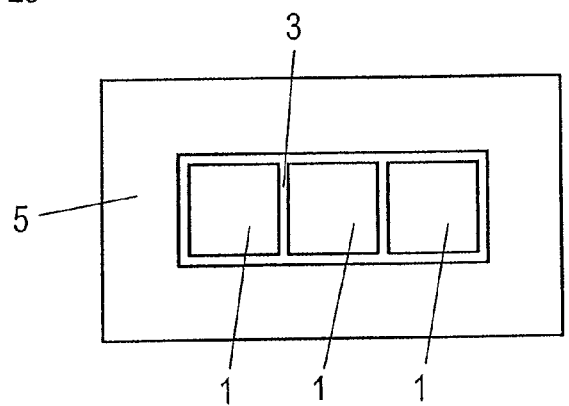
Fig. 1c
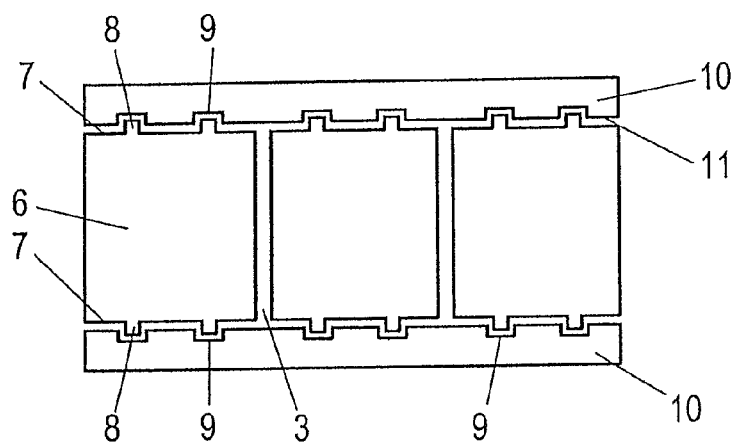
Fig. 1d
Fig. 2
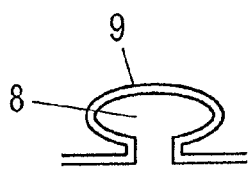
a.)
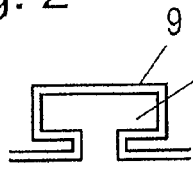
b.)
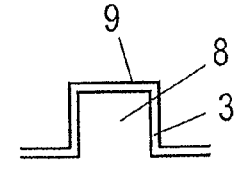
c.)

Fig. 3
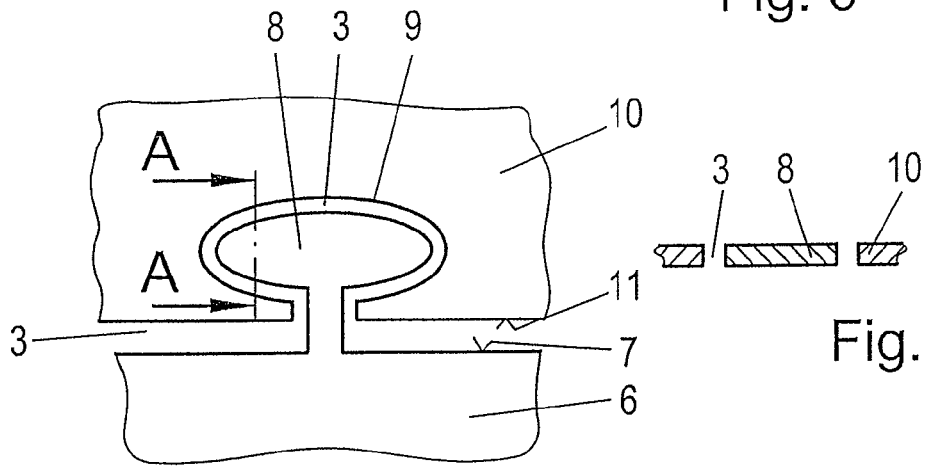
Fig. 3a
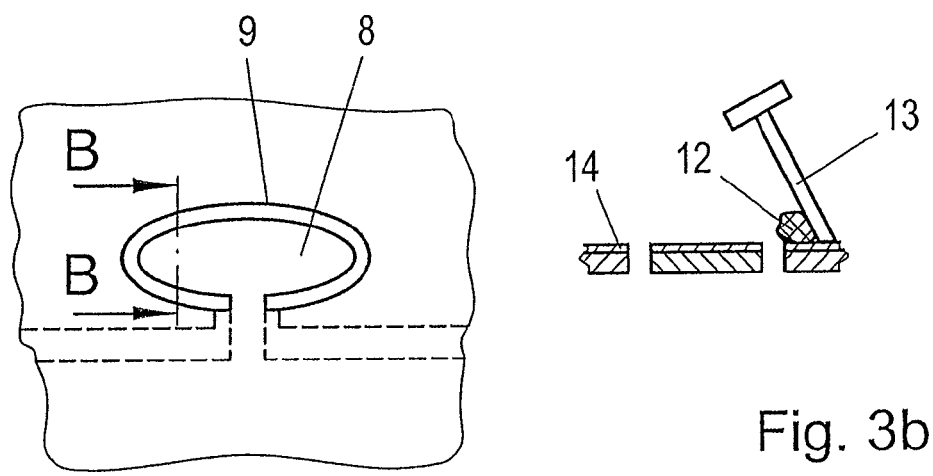
Fig. 3b
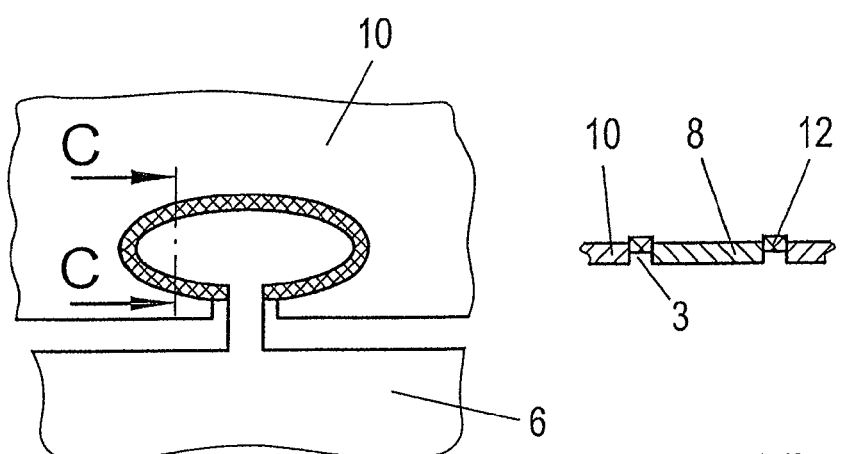
Fig. 3c

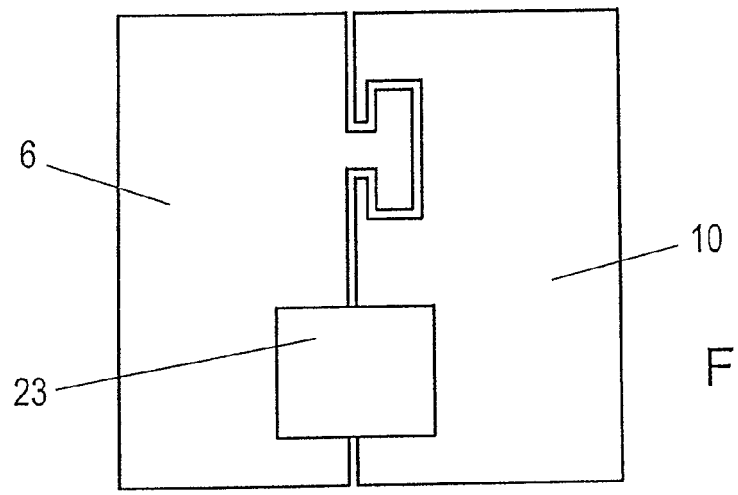
Fig. 7
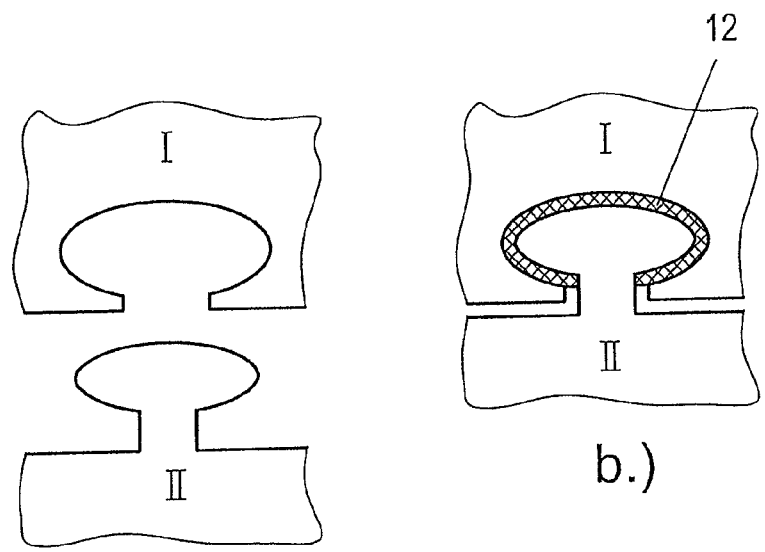
Fig. 8
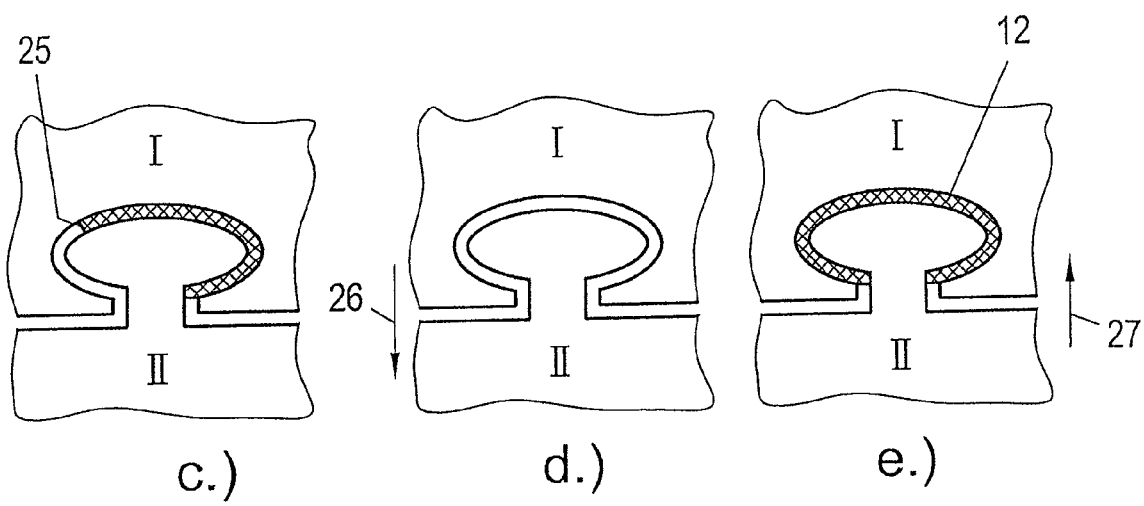

METHOD FOR CONNECTING A PLURALITY OF ELEMENTS OF A CIRCUIT BOARD

This is a national stage of PCT/AT2010/000316 filed Sep. 1, 2010 and published in German, which has a priority of Austria No. GM 552/2009 filed Sep. 3, 2009, hereby incorporated by reference.

FIELD OF THE INVENTION

The present invention relates to a method for connecting a plurality of elements of a printed circuit board, comprising the steps of
- providing with mutually matching contours the elements to be connected of a printed circuit board,
- arranging with mutually complementary contours in a close spatial relationship on at least one peripheral region the elements to be connected, while keeping a distance between the mutually facing peripheral regions, and
- mechanically connecting, particularly bonding or gluing, the mutually facing peripheral regions over at least portions thereof, for connecting the elements to be connected of the printed circuit board.

The invention relates furthermore to a printed circuit board comprising a plurality of interconnected elements, as well as the use of such method for the production of a multi-part circuit board.

PRIOR ART

In the context of the production of printed circuit boards, it is known to produce a plurality of printed circuit boards or printed circuit board elements on a common plate-shaped element, such printed circuit boards, as a rule, being each comprised of a plurality of conductive and insulating layers and/or of components integrated in such a printed circuit board. According to known production methods of this type, a substantially full-surface assembly of a plurality of printed circuit boards on the common plate-shaped element is effected, whereupon, after the completion of the printed circuit boards, the latter are separated from one another. In those cases, each of the printed circuit boards has a respective edge region about its periphery, and hence outside a substantially central region forming an actual printed circuit board element, in which the structures for the formation of the printed circuit board and/or the electronic component are integrated. Said edge region is provided for carrying out further printed circuit board processing steps, for instance, in the context of the insertion of components to be fixed to at least one surface and/or the installation into an electric or electronic device, in order to enable the manipulation and, in particular, the automatic seizure of such a printed circuit board during subsequent treatment or processing steps. According to presently known process controls, it is thus to be anticipated that the peripheral region to be provided for the frame or the peripheral region of the printed circuit board is likewise produced of a usually expensive material in accordance with the usually multi-layered printed circuit board. Such an edge or peripheral region, which is not required for the functioning of the printed circuit board, will however, result in elevated costs of such a printed circuit board, considering the usually multi-layered structure made of expensive materials. In addition, in the context of known production methods of printed circuit boards, regions or areas located between individual printed circuit board elements, of the common plate-shaped element are discarded as waste such that elevated costs for the production of printed circuit boards or printed circuit board elements will also occur in this respect.

In connection with the production of printed circuit boards it is, moreover, known to remove individual defective printed circuit boards from a common plate-shaped element if they are recognized as defective in the course of tests or checks, and to insert individual printed circuit boards in place of such removed, defective printed circuit boards.

In addition, methods for collectively processing and handling printed circuit boards are known, according to which several printed circuit boards or printed circuit board elements are usually inserted into frame elements each surrounding the printed circuit boards about their entire peripheries, and fixed to them, for instance, by bonding or gluing. In this respect, it is, for instance, referred to DE-A 1 906 00 928, U.S. Pat. No. 4,689,103, U.S. Pat. No. 5,044,615, U.S. Pat. No. 5,866,852 or WO 2009/068741. Those known methods for inserting printed circuit boards into a frame element each completely surrounding the printed circuit boards, in particular, involve the drawbacks that the reception openings to be provided in the frame element for the arrangement and pressfitting of the printed circuit boards have to be precisely adapted to the dimensions and shapes of the printed circuit boards to be inserted, while observing small manufacturing tolerances, and the proper positioning and fixation, for instance by bonding, on the peripheral edges of the printed circuit boards and frame elements, which usually have comparatively small thicknesses, are therefore extremely difficult and complex.

It is, moreover, known to assemble individual printed circuit boards of a plurality of elements produced, for instance, according to the above exposition, such elements having, for instance, been produced in different methods steps or production processes, as can, for example, be taken from US 2008/0144299 A1 or US 2009/0014205 A1.

For the simultaneous processing of printed circuit boards or printed circuit board elements, it is further known to temporarily connect printed circuit boards lying on a common transport path in a processing line, as can, for instance, be taken from WO 03/005785, wherein, after the completion of the processing of such several printed circuit board elements arranged in a common transport plane, the separation of the interconnected printed circuit boards or printed circuit board elements is effected.

SUMMARY OF THE INVENTION

The invention aims to prevent or minimize the problems of known configurations, particularly in the context of a precisely fitting connection of several printed circuit board elements. The present invention, in particular, aims to provide a method, and a printed circuit board, of the initially defined kind, in which the connection of at least two elements to a common printed circuit board can be realized in a simplified manner while avoiding tight and precise production tolerances, favorably in a largely automated fashion.

To solve these objects, a method for connecting a plurality of elements of a printed circuit board according to the kind mentioned-above is substantially characterized in that the printed circuit board elements to be connected are arranged or supported on a carrier element for carrying out the connecting procedure, that the printed circuit board elements to be connected are kept secured to the carrier element during the connecting procedure by applying a vacuum, by clamping, by elevations or pins projecting from the carrier element entering complementary recesses of the elements, or the like and that the surface of the carrier element facing the elements to be supported is formed by, or coated with, an antiskid material, e.g. silicone, rubber or the like.

Due to the fact that, after having provided with mutually matching contours the printed circuit board elements to be connected, the elements to be connected are arranged while keeping a distance between the mutually facing peripheral regions to be connected and are subsequently mechanically connected, particularly bonded or glued, it is ensured that a reliable connection of printed circuit board elements to be connected will be achievable even when observing smaller production tolerances, and hence by a simpler and quicker element production. It will, thus, for instance, also be possible to simply and reliably provide printed circuit board elements produced, or to be produced, in different methods steps with regard to the contours of peripheral regions to be connected, so that it will not be necessary to observe the tight and precise production tolerances essential for press fitting, as required in the initially mentioned embodiments according to the prior art. By keeping a distance, the appropriate space or clearance required, in particular, for the introduction of an adhesive will, moreover, be provided, which, while again simplifying processing and connecting operations, will ensure or enable a quicker connecting operation of such printed circuit board elements and, in particular, the automation of such a connecting operation. For a reliable support of the elements to be connected as well as for supporting an automation, it is proposed according to the invention that the printed circuit board elements to be connected are arranged or supported on a carrier element for carrying out the connecting procedure. In order to secure the at least temporary positioning of individual elements on the carrier element prior to realizing the final connection of elements to be connected, it is proposed according to the invention that the printed circuit board elements to be connected are kept secured to the carrier element during the connecting procedure by applying a vacuum, by clamping, by elevations or pins projecting from the carrier element entering complementary recesses of the elements, or the like. For the at least temporary securing or positioning on the carrier element, of the printed circuit board elements to be connected, it is alternatively or additionally proposed according to the invention that the surface of the carrier element facing the elements to be supported is formed by, or coated with, an antiskid material, e.g. silicone, rubber or the like.

Considering the usually small-dimensioned elements of a printed circuit board as well as the production tolerances to be observed, which have to be complied with even in the context of automated production processes, it is proposed according to a preferred embodiment that the distance between the mutually facing peripheral regions to be connected is selected to be 500 µm at most and, in particular, 200 µm at most. By keeping such a distance between the peripheral regions to be connected, it will be ensured that a reliable and relative positioning of individual such printed circuit board elements will be achievable even in an automated fashion, such a distance being safely achievable and keepable even when observing comparatively large production tolerances. In addition, the selection of such a distance proposed by the invention will also enable the quick and reliable introduction of, for instance, an adhesive into at least portions of peripheral regions to be connected, of the elements to be connected. Furthermore, the keeping of such a small distance proposed by the invention, between elements to be connected will also permit the consideration of requirements in view of a miniaturization of the printed circuit boards or printed circuit board elements to be produced.

For the proper relative positioning of elements to be connected, it is proposed according to a further preferred embodiment that elements to be connected are arranged and connected with reference to at least one aligning or registering element provided on one of the elements to be connected. Such an aligning or registering element can, for instance, be formed by an opening or passage provided on at least one of the elements to be connected. When treating or processing a plurality of printed circuit boards each optionally comprised of several elements, it is, moreover, known to provide an appropriate plurality of aligning or positioning elements for such plate-shaped or panel-shaped arrays of several printed circuit boards, in order to enable the reliable positioning of a plurality of elements.

For the reliable and rapid connection of printed circuit board elements to be connected, it is, moreover, proposed that a thermally or chemically or UV or IR curable adhesive is used for bonding, as in correspondence with a further preferred embodiment of the method according to the invention.

Considering the elements of a printed circuit board and, in particular, insulating or plastic layers of such a, particularly multilayer, printed circuit board, which, as a function of the selected materials, must not be subjected to extremely high temperatures during subsequent processing steps, it is proposed according to a further preferred embodiment that thermal curing of the adhesive is carried out at temperatures between 80° C. and 300° C.

In order to achieve a reliable and targeted arrangement of the adhesive used for connecting the elements to be connected, it is proposed according to a further preferred embodiment that a high-viscosity adhesive is used. Such a high-viscosity adhesive can be appropriately introduced into the distances or clearances between the printed circuit board elements to be connected while, in particular, preventing flowing or excessive spreading in the region of the distances, even when taking into account the comparatively small distances of the elements to be connected.

For a particularly reliable application or arrangement of the adhesive in the distances of elements to be connected, it is, moreover, proposed that the adhesive is applied by the aid of a dispensing device or dispenser, template printing, screen printing or the like, as in correspondence with a further preferred embodiment of the method according to the invention.

In order to avoid spreading of the adhesive, particularly below elements to be connected, it is proposed according to a further preferred embodiment that the adhesive is merely introduced or arranged over a portion of the vertical extension of side edges of the peripheral regions to be connected. Particularly by selecting the appropriate viscosity of an adhesive and whilst taking into account the comparatively small distance between adjacent peripheral regions to be connected, of the elements to be connected, the adhesive will be safely prevented from filling-up and penetrating over the entire vertical extension of the gap or distance between elements to be connected.

For a, particularly temporary, positioning, for instance in the presence of a plurality of elements to be connected, wherein curing of the adhesive is, for instance, carried out after the arrangement of a plurality of such elements, it is proposed according to a further preferred embodiment that a temporary connection of peripheral regions to be connected is formed by using a removable adhesive tape or label. Such removable adhesive tapes or labels can be easily and reliably positioned and even after the arrangement of elements to be connected will additionally permit at least minor corrections of the respective mutual positions prior to realizing the final connection.

Particularly when using a carrier layer or carrier element, it is proposed, in order to avoid adherence during the introduction of an adhesive, particularly at an inadvertent passage of the adhesive through the entire clearance between the mutually facing peripheral regions, that a removable protective element, for instance a removable sheet of paper, is arranged below the peripheral regions to be connected, of the elements to be connected, as in correspondence with a further preferred embodiment of the method according to the invention. Such a protective element and, in particular, removable sheet of paper can be readily and reliably arranged at least in areas where peripheral regions to be connected are arranged during the connecting procedure, and can again be readily removed from the printed circuit board elements connected with one another upon completion of the connection.

By providing a distance between printed circuit board elements to be connected, which will not only be advantageous in view of the automated positioning of individual elements to be connected but also enable the simplified production of the same, an optionally required separation of elements to be connected or already connected may also be effected along the distance to be kept between the same. In this context, it is proposed according to a further preferred embodiment that connected elements of a printed circuit board can be separated along the interconnected peripheral regions, e.g. for repair purposes, particularly by using a cutter or laser. In this manner, expensive elements of a printed circuit board can thus, for instance, be removed from such a printed circuit board in case of damage and replaced with new elements, so that a printed circuit board need not be completely exchanged at a locatable damage of merely a portion thereof.

While substantially linear peripheral regions of printed circuit board elements to be connected can be reliably connected by the mechanical connection, particularly bonding, provided by the invention, it is proposed according to a further preferred embodiment, particularly for enabling the mutual engagement of portions of the peripheries to be connected, of individual elements, that elements to be connected in a manner known per se are each formed with at least one relatively complementary coupling element on peripheral regions to be connected. Such complementary coupling elements can likewise be produced in a simplified manner with accordingly large production tolerances while taking into account the distances to be kept between elements to be connected, and likewise allow for the substantially automated fitting-in of elements to be connected, said complementary coupling elements facilitating positioning and enhancing the mechanical strength of the connection.

In this context, it is proposed according to a further preferred embodiment that the at least one coupling element of an element to be connected is formed by a profiled coupling element projecting from the peripheral region of said element and received in a complementary recess of the element to be connected therewith, while keeping said distance. By providing appropriate coupling elements, the mechanical stability of the connection of the elements to be connected will thus, in particular, be further improved or enhanced.

Particularly when arranging or providing frame or carrier elements for receiving or holding elements of a printed circuit board which are, for instance, made of more cost-effective materials and can be used for treating or processing purposes, it is proposed according to a further preferred embodiment that a substantially rectangular element of a printed circuit board, on respectively opposite peripheral regions, is each provided with at least one coupling element each connected with a coupling element of a frame or carrier element cooperating therewith.

As already pointed out above, it is possible to produce several elements to be used for the production of a printed circuit board and to be connected with one another, in, for instance, different production steps and at, for instance, different construction expenditures, so that it is, moreover, preferably proposed according to the invention that a plurality of elements of a printed circuit board are connected with one another in a spaced-apart relationship.

To solve the initially mentioned objects, a printed circuit board comprised of a plurality of interconnected elements is essentially characterized in that at least two elements to be connected of the printed circuit board are mechanically connected, particularly bonded or glued, with one another on at least one peripheral region thereof while keeping a distance and being supported on a carrier element. As pointed out above, an automation of the production of such printed circuit boards comprised of at least two elements will also be feasible in a favorable manner whilst observing accordingly large production tolerances for the elements to be connected.

For a proper mechanical connection in compliance with the requirements, for instance with regard to a miniaturization of such printed circuit boards, it is, moreover, proposed in a preferred manner that the distance between the mutually facing peripheral regions to be connected is selected to be 500 µm at most and, in particular, 200 µm at most.

For the proper mutual positioning of individual elements to be connected, it is, moreover, proposed that elements to be connected are arranged, and connected with one another, with reference to at least one aligning or registering element provided on one of the elements to be connected, as in correspondence with a further preferred embodiment of the printed circuit board according to the invention.

For a reliable and simple connection, it is, moreover, proposed in a preferred manner that a thermally or chemically or UV or IR curable adhesive is used for bonding, adhesives curing in such a manner being known per se in the context of the production of printed circuit boards.

For a reliable connection, it is, moreover, proposed that the adhesive is merely introduced or arranged over a portion of the vertical extension of side edges of the peripheral regions to be connected, as in correspondence with a further preferred embodiment of the printed circuit board according to the invention.

For an optionally required separation, particularly upon detection of a damage of a portion of the printed circuit board according to the invention, it is, moreover, proposed that connected elements of a printed circuit board are separable along the interconnected peripheral regions, e.g. for repair purposes, particularly by using a cutter or laser, as in correspondence with a further preferred embodiment of the invention.

For the simple positioning and mechanically stable coupling or connection of elements to be connected, it is, moreover, proposed in a preferred manner that elements to be connected, in a manner known per se, are each formed with at least one relatively complementary coupling element on peripheral regions to be connected, wherein, in this context, it is proposed according to a further preferred embodiment that the at least one coupling element of an element to be connected is formed by a profiled coupling element projecting from the peripheral region of said element and received in a complementary recess of the element to be connected therewith, while keeping said distance.

In addition, the use of the method according to the invention for the production of a multi-part circuit board is proposed.

SHORT DESCRIPTION OF THE DRAWINGS

In the following, the invention will be explained in more detail by way of exemplary embodiments schematically illustrated in the drawing. Therein:

FIG. 1 illustrates schematic top views on different embodiments of connected elements of a printed circuit board, using the method according to the invention, an element of a printed circuit board partially encompassing a further element in FIG. 1a, a printed circuit board element being completely encompassed by a further element in the embodiment according to FIG. 1b, several printed circuit board elements being encompassed or surrounded by a common element in the embodiment according to FIG. 1c, and several printed circuit board elements being connected with one frame or carrier element each on respectively opposite edges in the embodiment according to FIG. 1d;

FIG. 2 on an enlarged scale depicts schematic views of different configurations of coupling elements between printed circuit board elements to be connected;

FIG. 3 schematically illustrates the course of procedure of connecting printed circuit board elements to be connected, FIG. 3a depicting the side-by-side arrangement of elements to be connected, FIG. 3b depicting the application of an adhesive for connecting the elements to be connected; and FIG. 3c depicting the state after having applied the adhesive;

FIG. 7 is a schematic view of a configuration of a temporary fixation of two elements to be connected, using an adhesive tape; and FIG. 8 schematically illustrates the course of procedure of connecting and subsequently separating two elements, for instance for repair purposes and for an exchange of one of such interconnected elements.

DETAILED DESCRIPTION OF PREFERRED EMBODIMENTS

Figure 4:
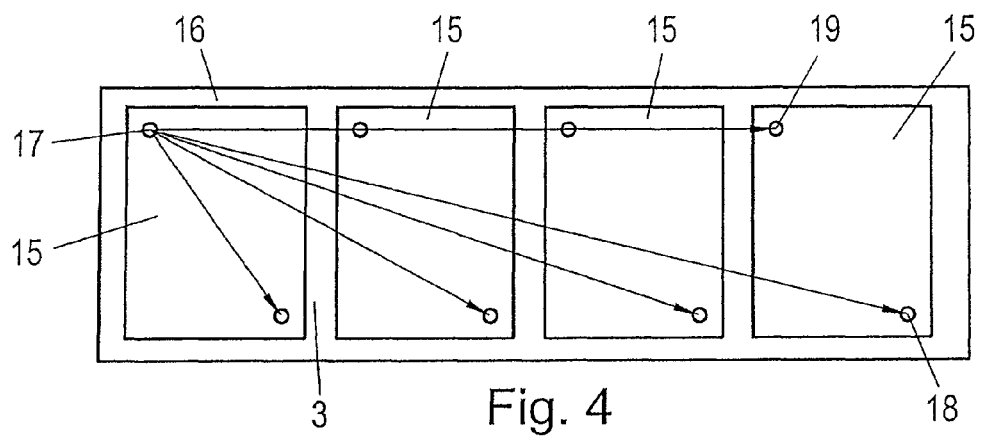
FIG. 4 is a schematic top view on the relative arrangement of a plurality of elements of a printed circuit board relative to one another with reference to at least one aligning or registering element.

In respect of the Figures, it is initially noted that in some cases only portions of elements of a printed circuit board to be produced are shown in the region of fixation of elements to be fixed to one another or connected with one another. Furthermore, the relative dimensions, particularly in regard to a distance to be provided between the individual elements, are not illustrated true to scale. Moreover, for a simplified illustration, no patterning is indicated and no components optionally attached or to be received are illustrated on the individual elements of a printed circuit board to be produced.

In the illustration according to FIG. 1, different options for connecting printed circuit board elements to be connected are schematically indicated, the indicated options merely showing exemplary embodiments not to be interpreted in a limiting sense.

In the embodiment according to FIG. 1a, a substantially rectangular or square element 1, on two peripheral sides, is surrounded by an element 2 to be connected therewith as will be discussed in more detail below, a distance or gap 3 being indicated between the elements 1 and 2 to be connected with each other. Mutually facing peripheral regions of the elements 1 and 2 are denoted by 28 and 29, respectively.

In the embodiment according to FIG. 1b, an again substantially square element 1 is surrounded by a likewise substantially square element 4, the square element 1 being, for instance, taken up on substantially all peripheral sides while substantially again keeping a distance or gap 3.

In the embodiment according to FIG. 1c, a plurality of elements again schematically indicated by 1 are received in a common element 5, a distance or gap 3 being again provided between the individual elements 1.

The different elements 1, 2, 4 and 5 of a printed circuit board, which are illustrated in FIGS. 1a to 1c, can, for instance, be produced by different production methods of a particularly multilayer printed circuit board and, upon completion of the same, can be connected or coupled with each other for providing a finished printed circuit board comprising different portions or elements, as will be discussed in more detail below.

In the embodiment according to FIG. 1d, it is indicated that a plurality of elements 6, on respectively opposite peripheral regions or side edges 7, are each provided with coupling elements schematically denoted by 8, said coupling elements 8 cooperating, or being connected, with complementary coupling elements 9 provided on frame or carrier elements 10. It is apparent, also from the embodiment according to FIG. 1d, that a distance or gap 3 is each provided or maintained in the regions of the coupling elements 8 and 9 as well as the adjoining peripheral regions 7 of the elements 6 and the peripheral regions 11 of the frame elements 10.

FIG. 2 schematically depicts different embodiments of coupling elements, which, irrespective of their geometric shapes, are again denoted by 8 for the sake of simplicity, which cooperate with complementary recesses 9. As is apparent from the illustration according to FIG. 2, a distance or gap 3 is each again provided in the region of the mutually cooperating coupling elements 8 and 9.

While, in the illustration according to FIG. 1, coupling elements 8 and 9 are merely indicated in the embodiment according to FIG. 1d, it should be noted that such coupling elements 8 and 9 of elements to be connected, as are, for instance, indicated in FIG. 2 may also be used on the respective peripheral regions 28 and 29 in the embodiments illustrated in FIGS. 1a to 1c.

Moreover, the embodiments of coupling elements 8 and complementary recesses 9 illustrated in FIG. 2 are merely exemplary and not to be interpreted in a limiting sense.

A connection procedure of two elements to be connected will be discussed in more detail below with reference to the illustration of FIG. 3, wherein, for instance, for a configuration as illustrated in FIG. 1d using coupling elements 8 and 9 according to FIG. 2a, only portions of the elements to be connected are each shown in FIG. 3. In FIGS. 3a, 3b and 3c, a schematic top view on such a portion of a connection of mutually cooperating coupling elements 8 and recesses 9 is, furthermore, each indicated on the left-hand sides of the illustrations, while sections along lines A-A, B-B and C-C are additionally indicated for the individual method steps on the right-hand sides of the illustrations.

From the method step illustrated in FIG. 3a, it is apparent that elements to be connected, which are again denoted by 6 and 10 as in correspondence with the illustration according to FIG. 1d, in the region of their mutually complementary coupling elements are positioned relative to each other in such a manner as to each keep a distance 3 substantially over the entire periphery of the coupling elements 8 and 9 as well as in the region of the mutually facing peripheral regions 7 and 11 for the subsequent introduction of an adhesive.

The distance 3 is chosen to have a maximum width of 500 μm, favorably 200 μm, so as to allow the elements to be connected, which are optionally provided with additional coupling elements 8 and 9, to be produced with large production tolerances. The maintenance of such a distance of, for instance, 200 μm at most, moreover, also allows for the arrangement of a plurality of elements optionally forming a plurality of printed circuit boards on a common carrier element to be used for further processing, e.g. for inserting components, as will be discussed in more detail particularly with reference to FIG. 4, wherein relative orientation tolerances between such a plurality of elements to be arranged, of ±50 μm, in particular ±30 μm, are attainable or can be observed. By providing a maximum distance of 200 μm for the subsequent introduction of an adhesive, the automated assembly and connection of printed circuit board elements to be connected in this manner will be feasible such that cumbersome fitting procedures of elements, which will, in particular, have to be performed manually, can be obviated.

After having arranged in a spatially close relationship the elements to be connected, as is illustrated in FIG. 3a, the application of an adhesive 12 is, for instance, effected in the method step according to FIG. 3b by the aid of a doctor blade 13 using a template 14 such that, after having applied the adhesive 12 and removed the template 14, as is illustrated in the method step according to FIG. 3c, the adhesive 12 was introduced into the gap 13 for connecting the elements 6 and 10 to be connected.

As is apparent from the illustration according to FIG. 3c, the adhesive 12, which has a high viscosity, in a favorable manner is merely introduced over a portion of the vertical extension of the gap 3 so as to avoid a penetration of the adhesive 12 to the lower side of the elements 6 and 10, and hence the adherence of the elements to a carrier elements, particularly when supporting the elements 6 and 10 to be connected, as will be discussed in more detail with reference to FIG. 5. It is further apparent from the illustration according to FIG. 3c that, in particular as a function of the thickness of the template 14 employed, the adhesive 12 only slightly projects beyond the surfaces of the elements 6 and 10 such that, in particular, subsequent processing steps will not be impaired or affected.

The application of the adhesive as indicated in FIG. 3c is, for instance, followed by the curing of the same, using heat or UV light. When using a thermally curing or setting adhesive 12, temperatures between 80° C. and 200° C. are, for instance, selected in order to particularly avoid impairment to the already finished printed circuit board elements.

To simplify subsequent method steps, an adaptation of the expansion coefficient of the adhesive 12 to that of the adjoining elements 6 and 10, respectively, is moreover effected.

Instead of using the template printing process indicated in FIG. 3c, the adhesive 12 may, for instance, be applied by screen printing or by dispensing in the zones of the mutually facing peripheral regions 7 and 11 of the elements 6 and 10 to be connected.

From the illustration according to FIG. 3, it is, moreover, apparent that an arrangement of the adhesive 12, and hence a mechanical connection between the elements to be connected, is merely provided in the region of the coupling elements 8 and 9. Alternatively, a substantially full-area connection over the entire peripheral regions 7 and 11 of the elements 6 and 10 to be connected may be provided in order to, in particular, increase the strength of the connection of the elements 6 and 10 to be connected.

Such a method, particularly when increasing or improving the strength of a connection between adjacent elements 6 and 10 by supporting the coupling elements 8 and 9 will, for instance, enable the provision of a load-carrying capacity of, for instance, 2 kg, which will be sufficient for the further use or processing of such printed circuit boards. It will, moreover, also be ensured that no changes of the mechanical connection produced between the elements 6 and 10 to be connected will occur, for instance, in subsequent treatment or processing steps such as, e.g., reflow or soldering processes, for instance for fixing components.

FIG. 4 schematically indicates that, when positioning a plurality of elements 15 in a common element 16, particularly by departing from an aligning or registering element 17 formed, for instance, by a bore or passage, while keeping a respective maximum distance 3 of, for instance, 200 μm, the alignment of such neighboring elements 15 will be achievable with reference to aligning elements 18 and 19 additionally provided on the individual elements 15, while observing a tolerance of ±50 μm, in particular ±30 μm. The observance of such small tolerances of a relative alignment is especially necessary or beneficial for subsequent treatment or processing procedures such as the insertion of components, in order to fix components not illustrated in detail on such elements 15 in a likewise particularly automated fashion.

Figure 5:
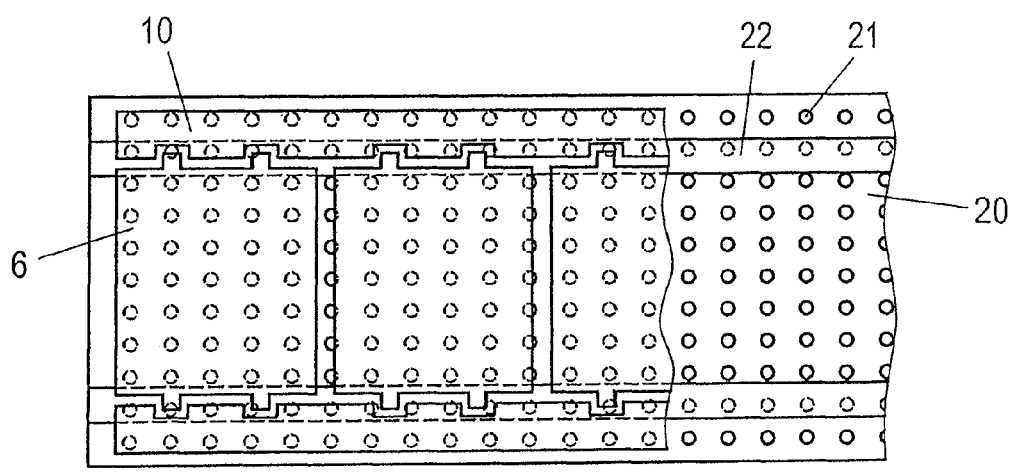
FIG. 5 is a schematic top view of a carrier element for arranging a plurality of printed circuit board elements to be connected, with a negative pressure or vacuum being generated and applied for temporary fixation.

From the schematic illustration according to FIG. 5, it is apparent that a plurality of elements to be each connected with one another, which are again denoted by 6 and 10 as in correspondence with the embodiment of FIG. 1d, are arranged on a carrier element schematically indicated by 20, which is formed with a plurality of openings or passages 21 for generating or applying a negative pressure or vacuum from a vacuum source not illustrated in detail.

In order to prevent the penetration of an adhesive in the region of the connection of the elements to be connected, and hence an adherence to the carrier element 20, it is, moreover, indicated in FIG. 5 that a protective layer, for instance a removable paper sheet 22, is arranged in the region of the bonding sites, which protective layer can be easily removed again after having connected the elements 6 and 10 to be connected, even after a penetration of the adhesive over the entire vertical extension of the peripheral regions to be connected, thus preventing the adherence to the carrier element 20 and, in particular, the contamination of the same by the adhesive.

Figure 6A:
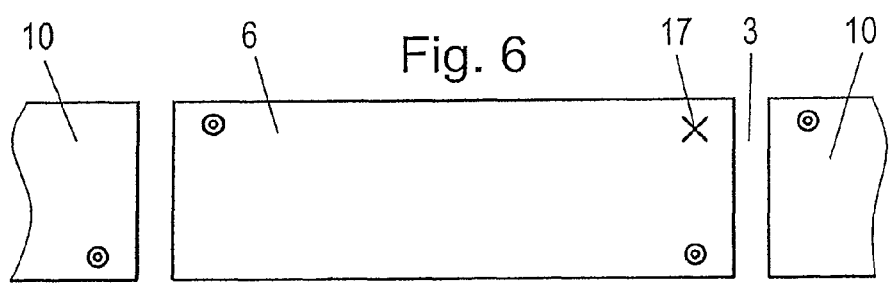
FIG. 6 is a schematic illustration of a modified embodiment of the arrangement of a plurality of elements on a carrier element, FIG. 6a depicting a schematic partial section and FIG. 6b being a schematic top view.
Figure 6B:
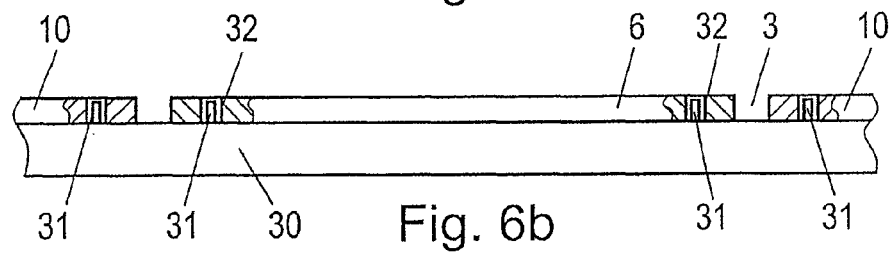

In the embodiment according to FIG. 6, a carrier element is denoted by 30, wherein elevations or pins 31 project from the carrier element 30, which, through openings or passages schematically indicated at 32, enter an element again denoted by 6 for at least temporarily securing elements to be connected with one another. With the element 6, which is temporarily secured to the carrier element 30 by the pins or elevations 31 cooperating with the openings 32, are subsequently connected elements again denoted by 10, in particular frame or carrier elements, which, also via pins again schematically indicated by 31, are secured on the carrier element 30 in their respective positions relative to the element 6 to be connected therewith, which has been omitted from FIG. 6b for the sake of clarity. An aligning or registering element again denoted by 17 is indicated for positioning or aligning.

In the same manner as described in respect to the preceding embodiments, an adhesive is again introduced into the gap 3 between the elements 6 and 10 for connecting elements 6 and 10.

In the illustration according to FIG. 6, the coupling elements which are, for instance, additionally provided in preceding Figures for connecting elements 6 and 10 are, moreover, not illustrated and can be omitted.

Instead of, and/or in addition to, holding or securing the elements to be connected by applying a vacuum as illustrated in FIG. 5 as well as by the positioning pins 31 and the respective openings or passages 32 for receiving the same as in accordance with FIG. 6, temporary securement on the carrier element 20 or 30 can, for instance, also be provided by clamping the individual elements to the carrier element until the application and, in particular, curing of the adhesive to be introduced into the distance or gap 3 between elements 6 and 10 to be connected has been completed.

In addition, or as an alternative, the surface of the carrier element 20 and/or 30 facing the elements 6 and 10 to be connected may be formed by an antiskid material such as silicone, rubber or the like, or coated with such material, in order to secure the relative positioning of the elements 6 and 10 to be connected. In this manner, an at least temporarily secured positioning of the elements 6 and 10 to be connected will be ensured, in particular, without additionally providing the application of a vacuum as indicated in FIG. 5 or using additional positioning pins 31 and respective recesses or passages 32 as indicated in FIG. 6.

In the illustration according to FIG. 7, it is schematically indicated that elements to be connected, which are again denoted by 6 and 10, are temporarily secured to each other by an adhesive tape or adhesive label 23, said adhesive tape 23 being removable again upon connection of the elements 6 and 10.

The distance or gap 3 provided between printed circuit board elements to be connected, which not only renders feasible the simplified production as well as the automated assembly and connection of the same, also enables, for instance, defective printed circuit board elements and, if necessary, printed circuit board elements loaded with expensive components to be separated again, particularly along the connection site or line, and, in particular, expensive elements of a printed circuit board to be replaced accordingly.

FIG. 8 schematically indicates such an exchange or repair process.

Departing from two printed circuit board elements I and II according to FIG. 8a, which are connected with each other according to FIG. 8b as is, for instance, illustrated in more detail in FIG. 3, the method step according to FIG. 8c comprises the separation of the interconnected printed circuit board elements I and II along the connection site 25 using, for instance, a cutter or laser.

After a separation along the coupling elements 8 and 9 as illustrated in FIG. 8c, the defective element II can be detached from element I as indicated by arrow 26 in FIG. 8d, whereupon a new element III is inserted in the sense of arrow 27 in FIG. 8e and connected with element I by a bond or glued connection again denoted by 12.

Thus, printed circuit board elements which are simple to produce with large processing tolerances can be safely and reliably connected with one another at reduced operating expenditures and, in particular, with the option of automated arranging and connecting procedures.

The invention claimed is:

1. A method for connecting a plurality of elements of a printed circuit board, comprising the steps of providing the elements with mutually complementary contours with vertical side walls at the elements' peripheral regions for connecting the elements together, placing the elements in a spaced apart position such that the vertical side walls of the mutually complementary contours are face each other, and a distance is provided between the mutually complementary contours, and connecting the elements by bonding or gluing the mutually complementary contours, wherein the elements are secured to the carrier during the connecting step by applying a vacuum, by clamping, by elevations or pins projecting from the carrier entering complementary recesses of the elements; wherein surface of the carrier facing the elements to be supported is formed by, or coated with, an antiskid material wherein a thermally or chemically or UV or IR curable adhesive is used for bonding or gluing; and wherein the adhesive is only introduced or arranged over a portion, not the entirety, of the vertical side walls of the mutually complementary contours to be connected.

2. The method according to claim 1, wherein the distance between the mutually complementary contours no more than 500 μm.

3. The method according to claim 1, wherein elements are arranged and connected with reference to at least one aligning or registering element provided on one of the elements.

4. The method according to claim 1, wherein thermal curing of the adhesive is carried out at temperatures between 80° C. and 300° C.

5. The method according to claim 4 wherein the adhesive is an high viscosity adhesive.

6. The method according to claim 1, wherein the adhesive is applied by the aid of a dispensing device, template printing, or screen printing.

7. The method according to claim 1, wherein a temporary connection of peripheral regions to be connected is formed by using a removable adhesive tape or label.

8. The method according to claim 1, wherein a removable protective layer is arranged below the peripheral regions of the elements.

9. The method according to claim 1, wherein connected elements are separated along the interconnected peripheral regions by using a cutter or laser.

10. The method according to claim 1, wherein each of the elements is provided with at least one coupling part on the peripheral regions.

11. The method according to claim 10, wherein the at least one coupling part is formed by a projection projecting from the peripheral region of said element and received in a complementary recess of the element to be connected therewith, while keeping said distance.

12. The method according to claim 10, wherein a substantially rectangular element of a printed circuit board, on respectively opposite peripheral regions, is each provided with at least one coupling part each connected with a coupling part of a frame or carrier cooperating therewith.

13. The method according to claim 2, wherein the distance between the mutually complementary contours is no more than 200 μm.

* * * * *

UNITED STATES PATENT AND TRADEMARK OFFICE
CERTIFICATE OF CORRECTION

PATENT NO. : 8,863,375 B2
APPLICATION NO. : 13/393697
DATED : October 21, 2014
INVENTOR(S) : Christoph Thumser et al.

It is certified that error appears in the above-identified patent and that said Letters Patent is hereby corrected as shown below:

On The Title Page, Item (73) Assignee
Please replace Item (73) "AT & S Austria Technologie & Sytemtechnik Aktiengesellschaft, Leoben-Hinterberg (AT)" WITH --AT & S Austria Technologie & Systemtechnik Aktiengesellschaft, Leoben-Hinterberg (AT)--

Signed and Sealed this
Seventeenth Day of February, 2015

Michelle K. Lee
*Deputy Director of the United States Patent and Trademark Office*